United States Patent [19]

Yodogawa

[11] Patent Number: 5,669,782
[45] Date of Patent: Sep. 23, 1997

[54] ELECTRICAL CONNECTOR

[75] Inventor: Akihiro Yodogawa, Fujisawa, Japan

[73] Assignee: Berg Technology, Inc., Reno, Nev.

[21] Appl. No.: 553,652

[22] PCT Filed: Jun. 3, 1994

[86] PCT No.: PCT/US94/06299

§ 371 Date: Apr. 16, 1996

§ 102(e) Date: Apr. 16, 1996

[87] PCT Pub. No.: WO94/29933

PCT Pub. Date: Dec. 22, 1994

[30] Foreign Application Priority Data

Jun. 3, 1993 [JP] Japan ................................. 5-133546

[51] Int. Cl.⁶ .................................................. H01R 13/62
[52] U.S. Cl. .................................................. 439/327
[58] Field of Search ............................. 439/327, 328, 439/326

[56] References Cited

U.S. PATENT DOCUMENTS 4,986,765  1/1991  Korsunsky ................. 439/326
5,112,242  5/1992  Choy et al. ................. 439/326
5,161,994  11/1992  Sato et al. .................. 439/326
5,203,714  4/1993  Tuan .......................... 439/326
5,302,133  4/1994  Tondreault ................. 439/157

FOREIGN PATENT DOCUMENTS 81215780  6/1994  Taiwan .

*Primary Examiner*—Gary F. Paumen
*Attorney, Agent, or Firm*—Woodcock Washburn Kurtz Mackiewicz & Norris LLP

[57] ABSTRACT

An electrical connector (2) for interconnecting a plurality of printed circuit boards or the like. A circuit board (6) is disposed in a recess (22) in the connector housing such that the circuit board is electrically interconnected to another circuit board (4) on which the connector is mounted. A latch (28) provides a retentive force for maintaining the circuit board in the recess of the connector housing. Actuation of a lever (48) coupled with the latch provides an effective force to disengage the latch from the circuit board such that the circuit board can be removed from the connector housing. A projection (42) can be provided on a latch-forming member for securing the connector on a circuit board or the like.

6 Claims, 5 Drawing Sheets

ELECTRICAL CONNECTOR

FIELD OF THE INVENTION

The present invention relates to an electrical connector and, in particular, to a connector for board-to-board interconnection.

BACKGROUND OF THE INVENTION

As a connector for electrically connecting a daughter board to a mother board, a zero insertion force type connector is known which allows the daughter board to be inserted therein with a low insertion force. This type of connector is disclosed in JPN UM Appln. No. 1-4128 and U.S. Pat. No. 4,986,765.

The zero insertion force type connector includes a housing of a resin mounted on a mother board. The housing has a recess for receiving one edge of a daughter board with male contact terminals arranged therein and a plurality of female contact terminals are arranged in the recess so as to electrically connect the mother board to the daughter board. The female contact terminals are comprised of C-shaped terminals having two contacts to be contacted with the daughter board.

When the daughter board is to be connected to the mother board, one edge of the daughter board is first inserted into the recess of the housing in an oblique relation to the surface of the mother board. Then the daughter board is rotated so that the daughter board is oriented at a vertical attitude relative to the surface of the mother board. The male contact terminals of the daughter board thus oriented are held under the spring action of the female contact terminals in the recess to electrically connect the male contact terminals to the female contact terminals.

When one edge of the daughter board is to be obliquely inserted into the recess of the housing, the daughter board can be inserted therein with a zero insertion force because the distance between the two opposed contacts of each contact terminal is greater than the thickness of the daughter board.

In order to fix the daughter board at a vertical attitude, a metal latch is provided at each end of the housing. During the rotation of the daughter board the respective metal latches are flexed away from the outer sides of the housing. When the daughter board reaches a vertical attitude, the metal latches are returned back to their initial configuration and the daughter board is sandwiched between the metal latches. At the same time, the respective metal latches support the surfaces of the daughter board and hence the daughter board is fixedly held at the vertical attitude. When the daughter board thus held is to be detached from the connector, the paired metal latches are flexed away from their outer sides and the daughter board is withdrawn.

It is true that, on the above connector, the daughter board can be inserted into the recess with a zero insertion force, but a force enough great to cause the metal latch to be flexed is required upon detachment and, further, inconvenient handling is involved. The user has to use both hands so as to flex the right and left metal latches simultaneously.

This type of connector is often used in a narrow space in a relatively small electronic device such as a personal computer and associated peripheral devices. Upon detachment of the daughter board an operation space is limited and, moreover, the user's field of vision is obstructed. It is also difficult to perform efficient operation.

SUMMARY OF THE INVENTION

It is accordingly the object of the present invention to provide a connector which can be readily detached from a circuit board.

According to one aspect of the present invention, an electrical connector is provided which electrically connects a first circuit board to a second circuit board through a plurality of contact terminals. The electrical connector includes a housing having a recess for receiving the second circuit board and a plurality of contact terminals located in the recess and mountable on the first circuit board, latching means for elastically latching, on at least one end of the recess, the second circuit board as it is received in the recess of the housing, and lever means, located near the latching means, for imparting a force, which resists an elastic force of the latching means to the latching means, under a lever action to release latching of the second circuit board by the latching means.

According to an embodiment of the present invention the housing and lever means are integrally molded by an injection molding.

Preferably the latching means has a latching section to be elastically latched to the second circuit board and a protection section covering a back side of the latching section and fixed to the first circuit board wherein, when the latching section is flexed toward the back surface side, the latching section abuts against the protection section whereby the latching section is prevented from being excessively flexed.

According to an embodiment of the present invention, the lever means is made of a metal and the lever means and latching means can be integrally formed from the same metal member.

Alternatively the latching means and lever means are individually formed and both may be mechanically coupled to each other.

According to another feature of the invention, a latching means is provided with a projection, preferably formed at or near a location where latching occurs, for fixing an electrical connector onto a circuit board or the like, as by soldering for example.

The housing can be adapted to have the first circuit board mechanically connected in a parallel, vertical or an oblique relation to the second circuit board. Here the terms "parallel" and "vertical" are intended to mean not only a mathematically strict sense of the word but also "substantially parallel" and "substantially vertical" in a broader sense of the word.

According to the above electrical connector, a force resisting an elastic force of the metal latch acts by the simple operation of the lever means and the engagement of the metal latch with the second circuit board is released, thus allowing ready withdrawal of the second circuit board.

Within the range of the object of the present invention the term "lever" means that, with the fulcrum as a load, a force applied to one end is transmitted as an inverted version of force to the other end of the lever and it does not matter whether one end or the other end of the lever is located near the fulcrum.

DETAILED DESCRIPTION OF THE PREFERRED EMBODIMENTS

Figure 1:
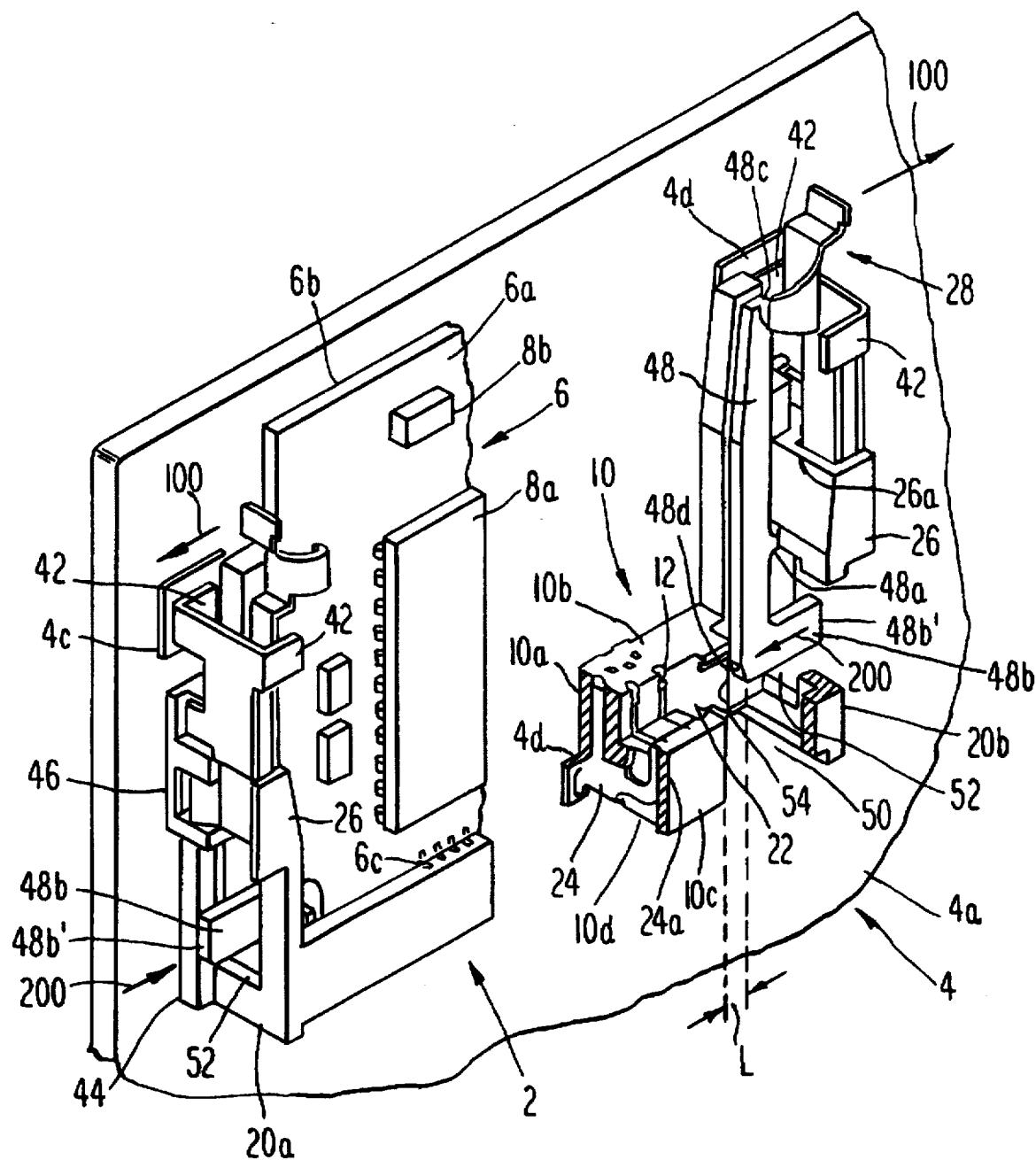
FIG. 1 is a perspective view showing a connector, partly in cross-section, according to a first embodiment of the present invention, the connector electrically connecting a daughter board to a mother board.
Figure 2:
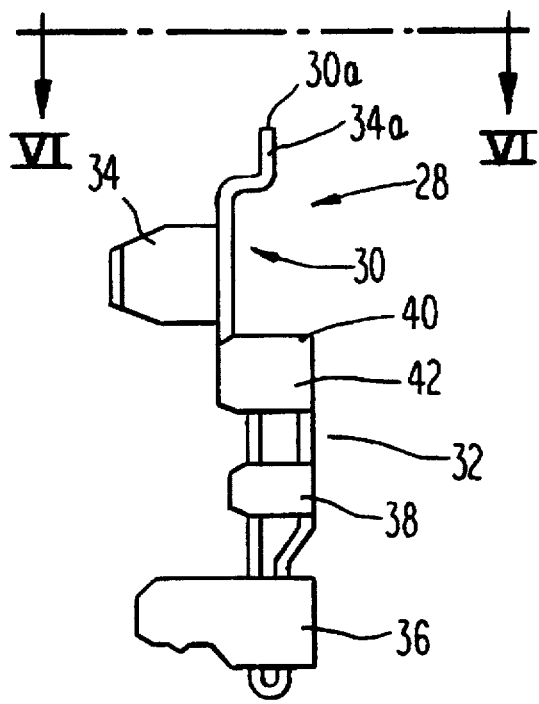
FIG. 2 is a side view showing a metal latch, as viewed from the mother board side, which is used for the connector shown in FIG. 1.
Figure 3:
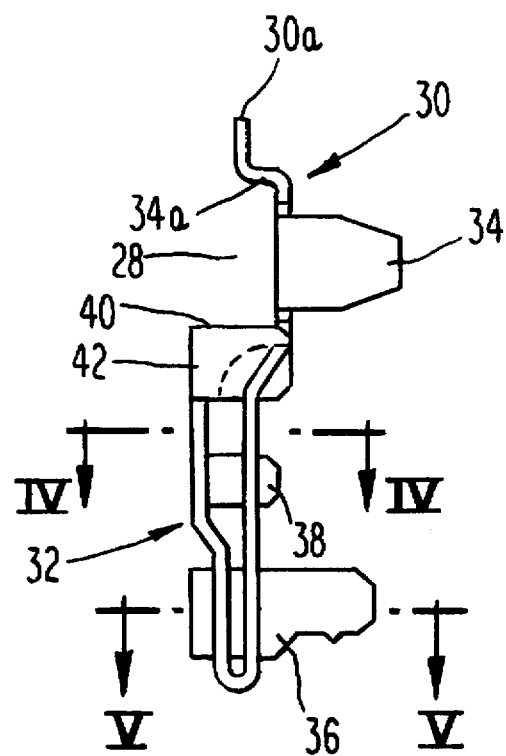
FIG. 3 is a side view showing the metal latch of FIG. 2 as viewed from an opposite side.
Figure 4:
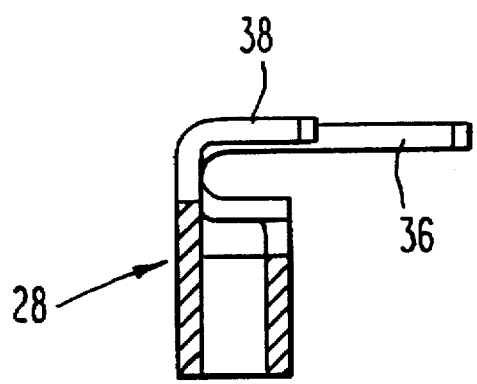
FIG. 4 is a view showing the metal latch of FIG. 3, as taken along line IV—IV, the metal latch being shown partly in cross-section.
Figure 5:
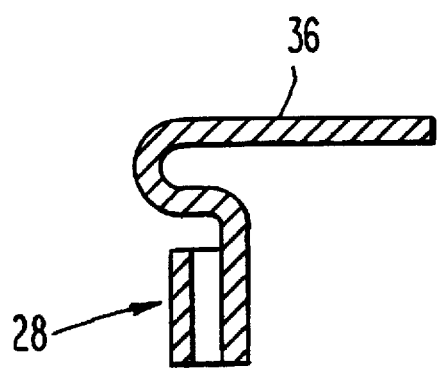
FIG. 5 is a view, partly taken along line V—V in FIG. 3, showing the metal latch of FIG. 3.
Figure 7:
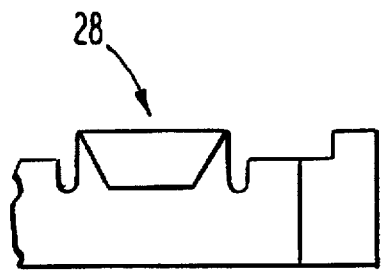
FIG. 7 is a view, taken along line VII—VII in FIG. 6, showing the metal latch of FIG. 6.
Figure 6:
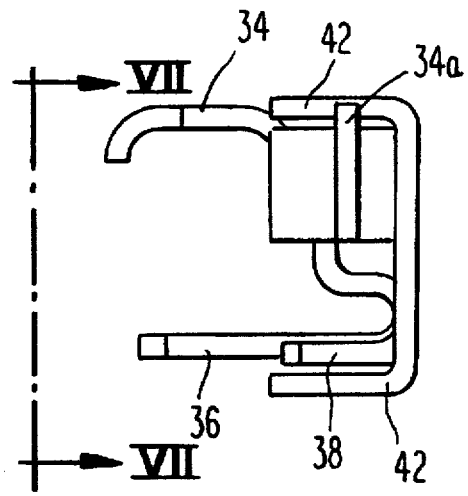
FIG. 6 is a view, taken along line VI—VI in FIG. 2, showing the metal latch of FIG. 2.

Referring to FIG. 1, a connector 2 is mounted on a surface 4a of a mother board 4 and a daughter board 6 is inserted into the connector 2. The mother board 4 is connected by the connector 2 to the daughter board 6. The mother board 4 in the present embodiment is a memory control circuit board and the daughter board 6, generally a single in-line memory module, having circuit elements, such as memory elements 8a and its peripheral units, mounted thereon in a known manner.

Solder pads 6c are provided on front and rear surfaces 6a and 6b of daughter board 6 at one edge area.

The connector 2 is provided with a housing 10 made of a synthetic resin material having a desired insulating property. The housing is configured in a mirror image relation on the right and left end sides. In FIG. 1, only the right and left end sides of the housing are shown. Here, the right end side of the housing is shown partially broken or omitted in order to more clearly show an inner structure of the housing and associated components.

One side surface 10a of the housing 10 is a surface on which the mother board 4 is mounted and an upper surface 10b is a surface where a daughter board 6 is inserted. The other surface 10c and bottom surface 10d of the housing 10 are opposed to the one surface 10a and upper surface 10b thereof, respectively.

A plurality of cavities 12 are provided in the upper surface 10a of the housing 10 so as to allow associated terminals to be forced therein. The cavities 12 are provided at intervals in a parallel way along the longitudinal direction of the housing 10. The respective cavities 12 extend from the upper surface 10b of the housing 10 toward the bottom surface 10d of the housing 10.

A recess 22 is provided from near the one end 20a to near that other end 20b of the housing 10 so as to allow a circuit board to be received therein. The recess communicates with the respective cavities 12.

Contact terminals 24 forced from the bottom surface 10d into the recess 12 of the housing 10 are arranged in the recess 22. The contact terminals are soldered to solder pads 4b on the mother board in a known manner.

Supports 26 are arranged upright preferably on both the end sides of the recess 22 of the housing 10 so as to support corresponding metal latches 28. The support 26 has a space 26a at its inner surface side. The metal latch can be supported by fitting the metal latch in the space.

The metal latch 28 as shown in FIGS. 2 to 7 are pushed out of a metal plate, such as phosphor bronze, having a desired elastic property.

The metal latch 28 has an elastic section 30 and mount section 32. The elastic section 30 and mount section 32, each, have an open end and closed end.

The elastic section 30 of the metal latch 28 has a cam latch 34 below and near an open end 30a of the elastic section 30. The cam latch 34 extends from the metal latch support member 26 side toward the recess 22 and can engage with the side edge of daughter board 6.

A finger-engaging portion 34a may be provided at an area between the cam latch 34 and the open end 30a of the elastic section 30 so that the engagement of the cam latch 34 with daughter board 6 may be released manually. According to the present invention, the finger-engaging portion 34a is not essential because the engagement of the cam latch 34 with daughter board 6 can be released by the operation of a lever unit 48 as will be set out below.

The closed end portion of the elastic section 30 of the metal latch 28 is bent and merges with the closed end of the mount section 32 of the metal latch 28. The mount section 32 has a first force-insertion portion 36 extending near and above the closed end thereof and a second force-insertion portion 38 extending near above the first force-insertion portion 36. Further, the mount section 32 has a pair of protection projections 42 at its open end 40. The first and second force-insertion portions 36 and 38 and protection projections 42 of the mount section 32 extend in the same direction as that in which the cam latch 34 of the elastic section 30 extends. The first and second force-insertion portions 36 and 38 of the mount section 32 are force-inserted into the space 26a of the metal latch support member 26 whereby the metal latch 28 is fixed to the metal latch support member 26. The metal latch support member 26 and mount section 32 can be variously designed so as to support the metal latch 28 by the metal latch support member 26.

The protection projections 42 of the mount section 32 form a protection section of a U-shaped cross-section wherein one end of the protection projections 42 contacts the back surface of the cam latch 34. If the cam latch 34 is flexed toward the back end side in the absence of such a protection section, the metal latch 28 is fatigued or fails when it exceeds its elastic deformation limit. According to the present invention, however, the cam latch 34 is prevented from being excessively flexed by allowing a portion of the protection section to abut against the back surface of the cam latch 34.

Referring again back to FIG. 1, one of the pair of protection projections 42 which faces the mother board 4 is preferably soldered at its lower surface to the solder pad 4c on the mother board 4. The metal latches are assembled to the latch supports 26 with a predetermined amount of preload tension. When the daughter board is rotated into contact with and against cam latch 34 the elastic section 30 is urged outwardly. Under a greater deformation force, the back surface of the cam latch 34 abuts against the protection portion of the mount section 32, thus preventing any excessive deformation of the metal latch. By soldering the protection projection 42 to the mother board 4, the protection section of the mount section has mechanical strength great enough to withstand a force tending to go in the outer direction of the metal latch 28.

One side surface 46 of the metal latch support member 26 merging with the one side surface 10a of the housing 10 is mounted on the surface 4a of the mother board 4. Preferably the one side surface 46 of the metal latch support member 26 is soldered to a solder pad 4c on the surface 4a of the mother board 4.

Figure 8A:
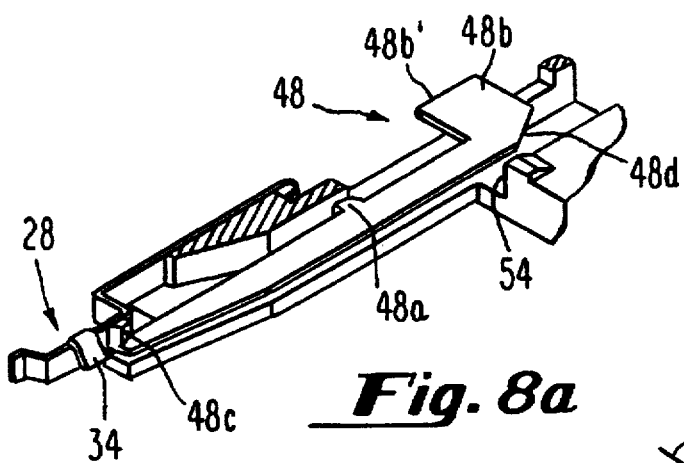
FIG. 8 is a view showing the operation of the metal latch and lever of FIG. 1.
Figure 8B:
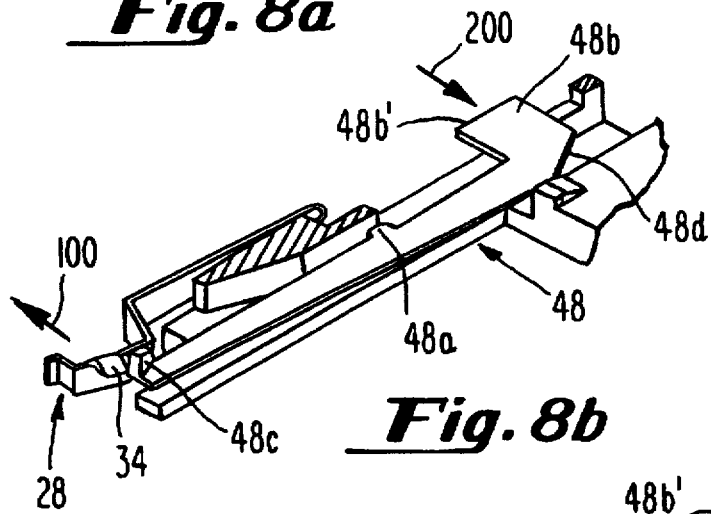
Figure 9:
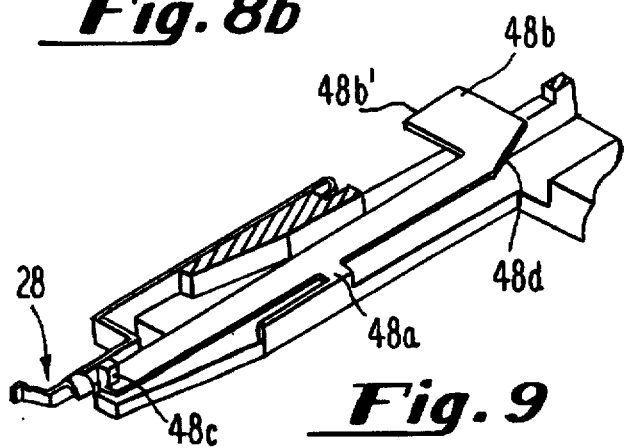
FIG. 9 is a view showing a variant of the lever in the first embodiment of the present invention.

Referring to FIG. 1 and FIGS. 8–9, the lever unit 48 is located near support 26 of the housing 10 such that a portion of the lever unit contacts a portion of the metal latch 28 for disengaging the daughter board 6 from the connector 2 in the manner described in detail below. The lever unit 48 comprises a synthetic resin material which, preferably is integrally molded with the housing, such as by injection molding.

The lever unit or lever arm 48 has a fulcrum 48a fixed to the housing 10, one end (input end) 48b near the fulcrum and the other terminal (output end) 48c remote from the fulcrum and being rotatable about the fulcrum 48a in a plane parallel to the surface 4a of the mother board 4.

The lever arm 48 is substantially rod-like with the input end 48b and output end 48c extending longitudinally in a direction away from the recess 22. The forward end surface 48b' of the input end 48b of the lever arm 48 provides a finger actuatable area. The forward end of the output end 48c provides a projection for pushing the cam latch 34 of the metal latch 28 in the direction of arrow 100 away from daughter board 6. Since the input end 48b and output end 48c are situated in near and remote positions, respectively, relative to the fulcrum 48a, the output end 48c is moved a significant distance in the direction of arrow 100 when the input end 48b is pushed a small distance in the direction of arrow 200 toward daughter board 6. That is, the lever 48 amplifies a moving distance of the input end 48b while reversing the moving direction so that a resultant force is transmitted to the output end 48c. With this movement, the projection of the output end 48c pushes the cam latch 34 of the metal latch 28 in the arrow 100 direction, thus releasing the engagement of the cam latch with daughter board 6.

On both sides 20 of the housing 10, a space 50 is provided for receiving the input end 48b of the lever arm 48 therein and an opening 52 is provided to allow the input end of the lever arm to be projected therefrom, the opening 52 leading to the space 50. Each end of the space 50 is defined by the opening 52 and corresponding wall 54. Thus, the input end 48b of the lever arm 48 is free to move in space 50 and through opening 52 when operated in the above-described manner.

If the lever arm 48 is excessively rotated, the fulcrum 48a receives a stress exceeding an elastic displacement, thus leading to a failure. This inconvenience is eliminated by properly setting a distance L from the opening 52 to the wall 54. That is, the excessive rotation and failure of the lever arm 48 are prevented by so setting the distance L as to allow the inner end face 48d of the input end to abut against the wall 54 when the input end 48b of the lever arm 48 is moved in the arrow 200 direction by a predetermined restriction distance.

The operation of the connector 2 will be explained below, considering the connector 2 mounted on the mother board 4. First, when daughter board 6 is to be connected to the mother board 4, the base end of daughter board 6 is inserted into the circuit board receiving recess 22 to connect the pads 6a of daughter board 6 to the terminal 24. At that time, daughter board 6 is placed in engagement with the cam latch 34 of the metal latch 28 so that daughter board 6 is held parallel to the mother board 4 and electrically connected by the terminals 24 to the mother board 4 in a known manner.

When daughter board 6 is to be detached from the connector 2, the input end 48b of the lever arm 48 is pushed in the direction of arrow 200 as shown in FIG. 8 and, by so doing, the output end 48c of the lever arm 48 is moved in the direction of arrow 100, pushing the cam latch 34 of the metal latch 28 in the direction of arrow 100 and disengaging the cam latch 34 from daughter board 6. The disengaged daughter board 6 can be readily withdrawn from the recess 22.

The operation of the lever arm 48 is efficient because the input end 48b of the lever arm has only to be pressed by the operator's fingers. Further daughter board 6 is usually of a small type and the distance between arms 48 on both sides is short, thus enabling the paired lever arms 48 to be simultaneously operated by one hand of the operator.

It is to be noted that, as shown in FIG. 9, the fulcrum 48a of the lever arm 48 can be provided, not only on the outer surface side, but also on the inner surface side of the lever.

Figure 10:
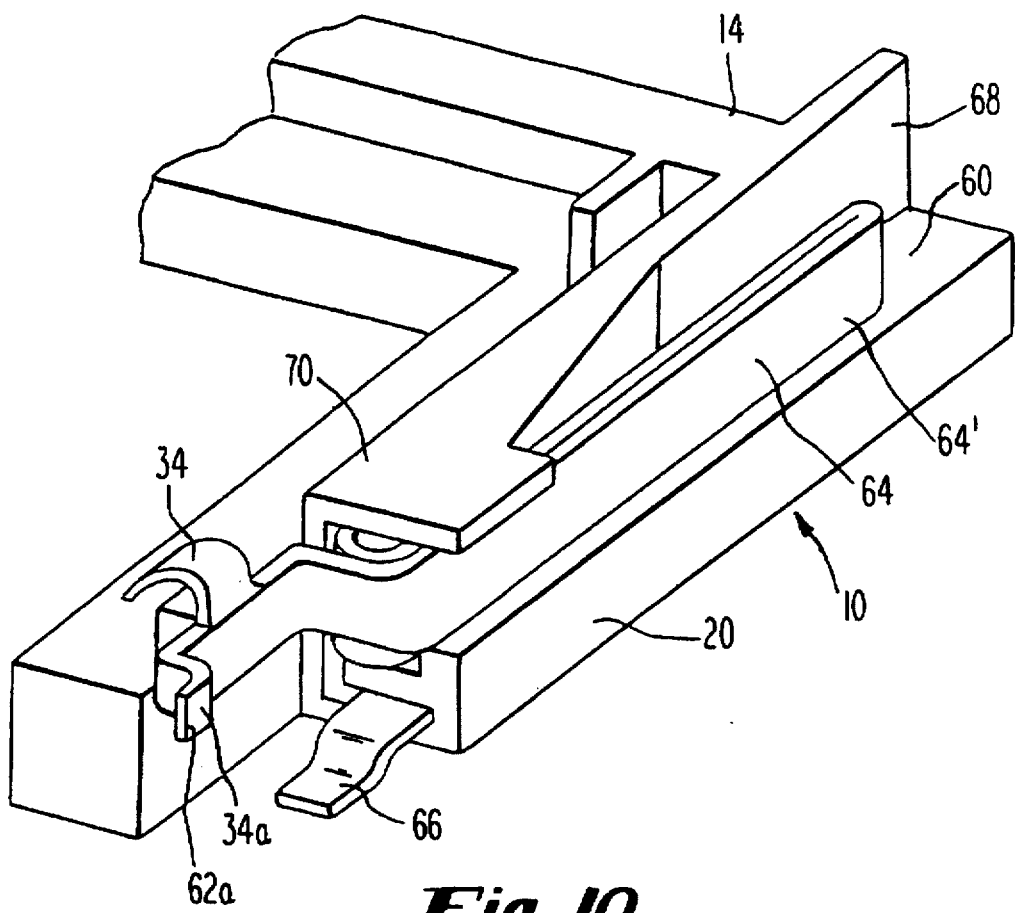
FIG. 10 is a perspective view showing a metal member providing a metal latch and lever on one end of a connector according to a second embodiment of the present invention.
Figure 11:
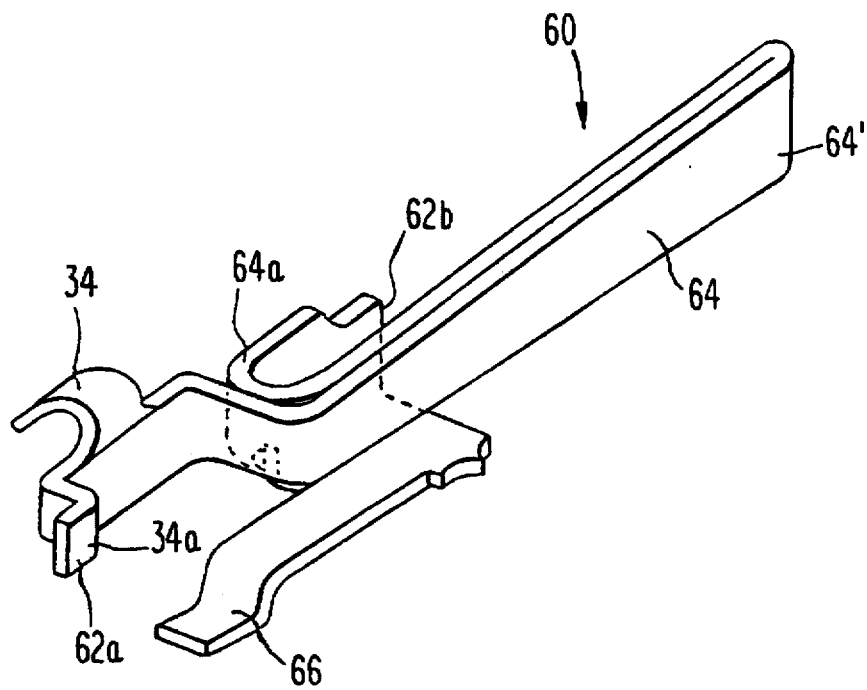
FIG. 11 is a perspective view showing a metal member in FIG. 10.

FIGS. 10 and 11 show a second embodiment of the present invention. The second embodiment is different from the first embodiment in the following manner. Instead of the metal latch 28 and synthetic resin lever unit 48, an integral metal member 60 can serve the function of both the metal latch and lever unit above. The metal member 60 is formed with the same material and method as those with which the metal latch 28 of the first embodiment is formed. The metal member 60 has a first end 62a and second end 62b (see FIG. 11) and a bent section 64 formed between the first end 62a and the second end 62b. On the first end 62a side a cam latch 34 and finger-engaging portion 34a are formed as in the case of the metal latch 28. The bent section 64 has a proper length to provide a lever arm. The arm near the second end of the metal member is curved to provide a fulcrum 64a (see FIG. 11) of the lever arm 64. A mount projection 66 is extended below the fulcrum 64a. The projection 66 is extended from the outer casing 10 and, for example, soldered to the mother board (see FIG. 1).

Regarding the use of the embodiment shown in FIGS. 10 and 11, it is not necessary that each end 20 of the outer casing 10 has a metal latch support member 26, space 50, opening 52 and wall 54 as described above when considering the embodiment of the lever and latch shown in FIGS. 2–9. As shown in FIG. 10, when the metal member 60 is used, each portion 20 of the outer casing 10 is provided with a wall 68 opposite the inner surface side of the lever arm 64. A support member 70 is provided on the forward end of the wall 68 to support the fulcrum 64a of the lever arm 64. By pushing one end (input end) 64' of the lever arm 64 toward the wall 68, the end 62a, constituting an output end of the lever arm 64, is moved away from daughter board 6 and the cam latch 34 can be disengaged from daughter board 6 in the same manner as in the prior embodiment.

Figure 12:
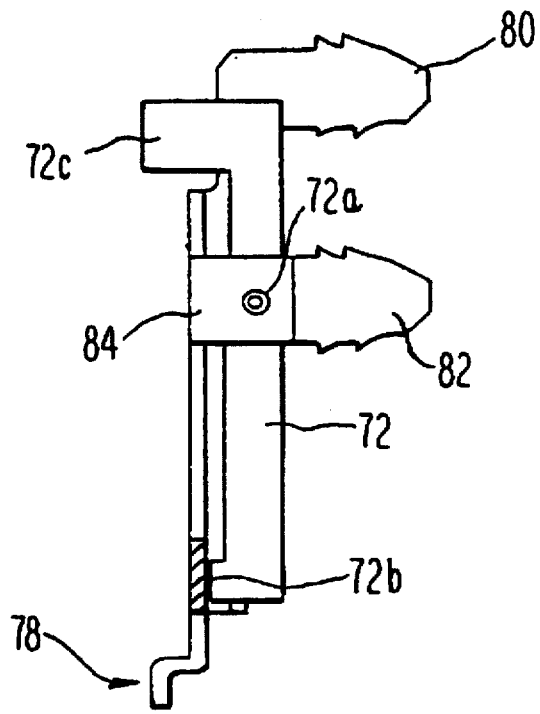
FIG. 12 is a plan view showing a metal latch and lever unit for use in a connector according to a third embodiment of the present invention.
Figure 13:
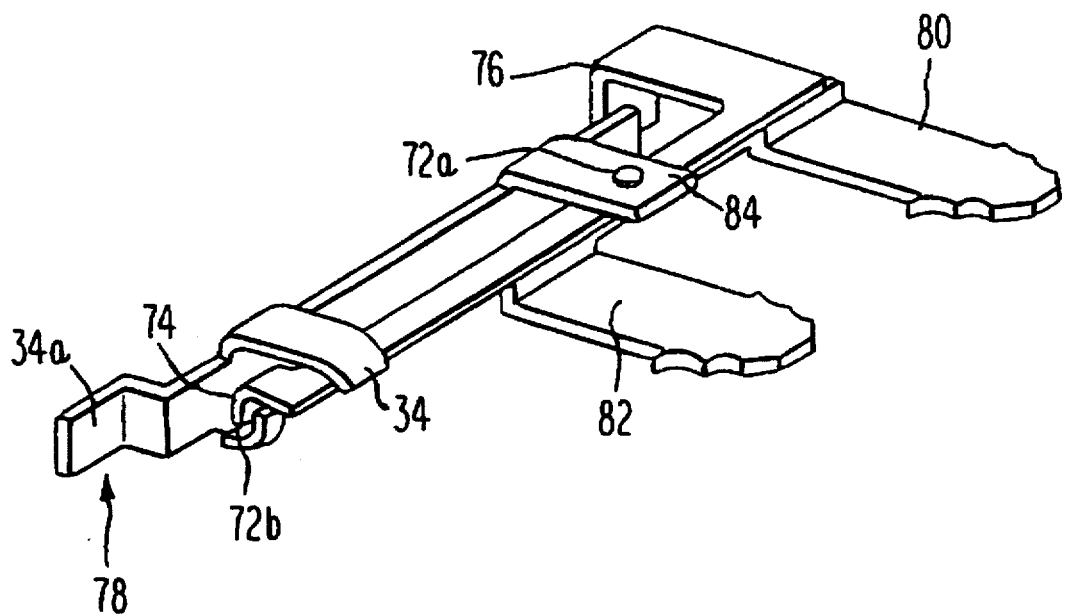
FIG. 13 is a view showing the metal latch and lever unit of FIG. 12.

FIGS. 12 and 13 show a third embodiment of the present invention. In this embodiment, an integral metal lever unit 72 is used in place of the synthetic resin lever unit 48 of the first embodiment. The metal lever unit or lever arm 72 has a fulcrum 72a, one end 72c (input end) near the fulcrum and the other end 72b (output end) remote from the fulcrum and is rotatable about the fulcrum 72a along the surface 4a of the mother board 4. The flat configuration of the lever arm 72 from the input end 72c to the output end 72b is of a substantially L-shaped type. The output end 72b has a projection 74 extending from its one side face and the input end 72c has an operation section 76 extending from its one side face.

Though the metal latch 78 of this embodiment is formed with the same material and method as the metal latch 28 of the first embodiment, their configurations are different from each other. The metal latch 78 has a cam latch 34, not shown in FIG. 12, and finger-engaging portion 34a formed on the one end side of the metal latch 78 as in the case of the metal latch 28 of the first embodiment. A first wedge-like section 80 for fixing the metal latch 78 to the housing 10 by biting into the housing 10 (not shown in FIGS. 12 and 13) of the connector is provided on one side face of the outer terminal of the metal latch 78. A second wedge-like section 82, similar to the first wedge-like section 80, extends at one side face between the ends of the metal latch. A support section 84 extends on the other side face of the metal latch 78 so as to support the fulcrum 72a of the metal lever arm 72 and connect together the latch metal 78 and lever arm 72.

The lever arm 72 having its fulcrum 72a supported on the support section 84 of the metal latch 78 serves as the lever arm 48 in the first embodiment. That is, by rotating the operation section 76 of the lever arm 72 by the finger of the operator the projection 74 pushes the cam latch 34 of the metal latch 78, thus disengaging the cam latch 34 from daughter board 6 in the manner set forth above.

The connector of the present invention is not restricted to the above-described embodiments and can be variously varied or modified without departing from the spirit and scope of the present invention. A plurality of daughter boards 6 can be connected to one connector by providing a plurality of recesses 22, associated metal latches and lever units.

Although, in the above embodiments and drawings, daughter board 6 has been so designed as to be connected to the mother board 4, it can be so designed as be connected in a vertical or an oblique way. Further it is also possible to change the operation section 76 of the lever arm 72 to a readily manually operable position in accordance with the attitude of daughter board 6.

What is claimed is:

1. An electrical connector for electrically connecting a first circuit board to a second circuit board through a plurality of contact terminals, comprising:

an electrically insulating housing having a recess receiving the second circuit board and the plurality of contact terminals located in the recess of the housing and mountable on the first circuit board;

a latch for elastically latching, on at least one end of the recess, the second circuit board received in the recess of the housing; and a lever rotatable about a fulcrum and located proximate the latch for imparting a force to the latch under a lever action to overcome an elastic force of the latch and release the second circuit board from the recess of the housing, wherein said lever comprises an input end and an output end on opposite sides of said fulcrum, and wherein a force applied at said input end in a first direction causes said output end to move in a second direction and apply a disengaging force to said latch.

2. The electrical connector according to claim 1, wherein the housing and lever are integrally molded by injection molding.

3. The electrical connector according to claim 1, wherein the latch has a latching section to be elastically latched to the second circuit board and a protection section covering a back side of the latching section and fixed to the first circuit board wherein, when the latching section is flexed toward the back surface side, the latching section abuts against the protection section whereby the latching section is prevented from being excessively flexed.

4. The electrical connector according to claim 1, wherein the latch and lever are integrally formed of the same metal member.

5. The electrical connector according to claim 1, wherein the lever is mechanically connected to the latch.

6. The electrical connector according to claim 1, wherein the housing is adapted to have the second circuit board mechanically connected in a parallel relation to the first circuit board.

* * * * *